United States Patent
Lee et al.

(10) Patent No.: US 10,388,685 B2
(45) Date of Patent: Aug. 20, 2019

(54) PORTABLE ELECTRONIC DEVICE AND IMAGE-CAPTURING MODULE THEREOF, AND IMAGE-SENSING ASSEMBLY THEREOF

(71) Applicant: AZUREWAVE TECHNOLOGIES, INC., New Taipei (TW)

(72) Inventors: Tseng-Chieh Lee, New Taipei (TW); Kung-An Lin, Taipei (TW)

(73) Assignee: AZUREWAVE TECHNOLOGIES, INC., New Taipei (TW)

( * ) Notice: Subject to any disclaimer, the term of this patent is extended or adjusted under 35 U.S.C. 154(b) by 0 days.

(21) Appl. No.: 15/709,756

(22) Filed: Sep. 20, 2017

(65) Prior Publication Data
US 2019/0013344 A1    Jan. 10, 2019

(30) Foreign Application Priority Data

Jul. 10, 2017 (TW) .............................. 106123045 A (51) Int. Cl.
*H01L 31/0232* (2014.01)
*H01L 27/146* (2006.01)

(52) U.S. Cl.
CPC .. *H01L 27/14625* (2013.01); *H01L 27/14618* (2013.01); *H01L 27/14634* (2013.01)

(58) Field of Classification Search
CPC ......... H01L 27/14625; H01L 27/14618; H01L 27/14634
USPC ....................................................... 257/432
See application file for complete search history.

(56) References Cited

U.S. PATENT DOCUMENTS

| | | | |
|---|---|---|---|
| 9,225,887 B1* | 12/2015 | Hsu ...................... | H04N 5/2254 |
| 2006/0035415 A1* | 2/2006 | Wood ................ | H01L 27/14618 |
| | | | 438/125 |
| 2018/0136434 A1* | 5/2018 | Alasirnio ................. | G03B 3/10 |

FOREIGN PATENT DOCUMENTS

| | | |
|---|---|---|
| JP | 2005181541 A | 7/2005 |
| JP | 2005259208 A | 9/2005 |
| JP | 2006005211 A | 1/2006 |
| JP | 2006287533 A | 10/2006 |
| JP | 2009003073 A | 1/2009 |
| JP | 2014057231 A | 3/2014 |
| KR | 20080011832 A | 2/2008 |
| KR | 20160132745 A | 11/2016 |
| TW | 201508367 A | 3/2015 |

\* cited by examiner

*Primary Examiner* — Tu-Tu V Ho
(74) *Attorney, Agent, or Firm* — Li & Cai Intellectual Property (USA) Office (57) ABSTRACT

The present invention provides a portable electronic device and an image-capturing module thereof, and an image-sensing assembly thereof. The image-sensing assembly includes an image-sensing chip, a spacer structure, and a filter element. The image-sensing chip has an image sensing area and a non-image sensing area surrounding the image sensing area. The spacer structure is disposed on the non-image sensing area. The filter element is disposed on the spacer structure so as to separate the filter element from the image-sensing chip by a predetermined distance. The image-sensing assembly can be applied to the image-capturing module, and the image-capturing module can be applied to the portable electronic device.

10 Claims, 8 Drawing Sheets

PORTABLE ELECTRONIC DEVICE AND IMAGE-CAPTURING MODULE THEREOF, AND IMAGE-SENSING ASSEMBLY THEREOF

FIELD OF THE INVENTION

The present disclosure relates to an image-sensing assembly, and more particularly to an image-capturing module using the image-sensing assembly, and a portable electronic device using the image-capturing module.

BACKGROUND OF THE INVENTION

The advantage of CMOS (Complementary Metal-Oxide-Semiconductor) is low power consumption and small size, thus allowing the CMOS sensor package module to be integrated into portable electronic devices with smaller sizes such as mobile phones or notebooks. However, when a glass filter is directly fixed on an image sensor through glue, or when the glass filter is separated from the image sensor, the glass filter would be titled relative to the image sensor.

SUMMARY OF THE INVENTION

One aspect of the present disclosure relates to a portable electronic device and an image-capturing module thereof, and an image-sensing assembly thereof.

One of the embodiments of the present disclosure provides an image-capturing module, including a circuit substrate, an image-sensing chip, a spacer structure, a filter element, and a lens assembly. The image-sensing chip is electrically connected to the circuit substrate, and the image-sensing chip has an image sensing area and a non-image sensing area surrounding the image sensing area. The spacer structure is disposed on the non-image sensing area. The filter element is disposed on the spacer structure so as to separate the filter element from the image-sensing chip by a predetermined distance. The lens assembly includes a holder structure disposed on the circuit substrate and a lens structure being held by the holder structure and corresponding to the image-sensing area.

More particularly, the spacer structure includes a plurality of prefabricated spacers, each having the same height, that are separated from each other and disposed on the non-image sensing area. Each of the prefabricated spacers has a first adhesive layer formed on a top surface thereof to connect with the filter element, each of the prefabricated spacers has a second adhesive layer formed on a bottom surface thereof to connect with the non-image sensing area, and the predetermined distance from the filter element to the image-sensing chip is substantially equal to the total height of the prefabricated spacer, the first adhesive layer and the second adhesive layer so as to prevent particles on the filter element from being imaged on the image sensing area of the image-sensing chip. The prefabricated spacer is one of a glass, a silicon chip and a semiconductor chip, both the first adhesive layer and the second adhesive layer are glue adhesions or glue tapes, and the filter element is a coated glass or a non-coated glass.

More particularly, the image-capturing module further includes a filling paste surroundingly disposed between the image-sensing chip and the filter element and connected to the prefabricated spacers to form an enclosed space between the image-sensing chip and the filter element so as to protect the image sensing area, wherein the image-sensing chip is disposed on a bottom surface of the circuit substrate, and the image-sensing chip is electrically connected to the circuit substrate through a plurality of electrical conductors.

More particularly, the image-capturing module further includes a filling paste surroundingly disposed between the image-sensing chip and the filter element and connected to the prefabricated spacers to form an enclosed space between the image-sensing chip and the filter element so as to protect the image sensing area, wherein the image-sensing chip is disposed on a top surface of the circuit substrate, and the image-sensing chip is electrically connected to the circuit substrate through a plurality of conductive wires.

More particularly, the image-capturing module further includes a filling paste surroundingly disposed between the image-sensing chip and the filter element and connected to the prefabricated spacers to form an enclosed space between the image-sensing chip and the filter element so as to protect the image sensing area, wherein the image-sensing chip is disposed on a top surface of the circuit substrate, and the image-sensing chip is electrically connected to the circuit substrate through a plurality of electrical conductors.

Another one of the embodiments of the present disclosure provides an image-sensing assembly, including an image-sensing chip, a spacer structure, and a filter element. The image-sensing chip has an image sensing area and a non-image sensing area surrounding the image sensing area. The spacer structure is disposed on the non-image sensing area. The filter element is disposed on the spacer structure so as to separate the filter element from the image-sensing chip by a predetermined distance.

More particularly, the spacer structure includes a surrounding prefabricated spacer disposed on the non-image sensing area to surround the image sensing area, and the height of the surrounding prefabricated spacer is uniform.

Yet another one of the embodiments of the present disclosure provides a portable electronic device using an image-capturing module, characterized in that the image-capturing module includes a circuit substrate, an image-sensing chip, a spacer structure, a filter element, and a lens assembly. The image-sensing chip is electrically connected to the circuit substrate, and the image-sensing chip has an image sensing area and a non-image sensing area surrounding the image sensing area. The spacer structure is disposed on the non-image sensing area. The filter element is disposed on the spacer structure so as to separate the filter element from the image-sensing chip by a predetermined distance. The lens assembly includes a holder structure disposed on the circuit substrate and a lens structure being held by the holder structure and corresponding to the image-sensing area.

More particularly, the spacer structure includes a plurality of prefabricated spacers, each having the same height, that are separated from each other and disposed on the non-image sensing area, wherein each of the prefabricated spacers has a first adhesive layer formed on a top surface thereof to connect with the filter element, each of the prefabricated spacers has a second adhesive layer formed on a bottom surface thereof to connect with the non-image sensing area, and the predetermined distance from the filter element to the image-sensing chip is substantially equal to the total height of the prefabricated spacer, the first adhesive layer and the second adhesive layer so as to prevent particles on the filter element from being imaged on the image sensing area of the image-sensing chip, wherein the prefabricated spacer is one of a glass, a silicon chip and a semiconductor chip, both the first adhesive layer and the second adhesive layer are glue adhesions or glue tapes, and the filter element is a coated glass or a non-coated glass.

More particularly, the portable electronic device further includes a filling paste surroundingly disposed between the image-sensing chip and the filter element and connected to the prefabricated spacers to form an enclosed space between the image-sensing chip and the filter element so as to protect the image sensing area.

Therefore, by matching the features of "the spacer structure being disposed on the non-image sensing area" and "the filter element being disposed on the spacer structure so as to separate the filter element from the image-sensing chip by a predetermined distance," the parallelism of the filter element relative to the image-sensing chip can be maintained so as to prevent the filter element from being tilted relative to the image-sensing chip, and particles that may have been attached to the filter element would not be easily imaged on the image sensing area of the image-sensing chip. Hence, the production yield rate of the present disclosure would be increased.

To further understand the techniques, means and effects of the present disclosure, the following detailed descriptions and appended drawings are hereby referred to, such that, and through which, the purposes, features and aspects of the present disclosure can be thoroughly and concretely appreciated. However, the appended drawings are provided solely for reference and illustration, without any intention to limit the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DETAILED DESCRIPTION OF THE PREFERRED EMBODIMENTS

Embodiments of a portable electronic device and an image-capturing module thereof, and an image-sensing assembly thereof according to the present disclosure are described herein. Other advantages and objectives of the present disclosure can be easily understood by one skilled in the art from the disclosure. The present disclosure can be applied in different embodiments. Various modifications and variations can be made to various details in the description for different applications without departing from the scope of the present disclosure. The drawings of the present disclosure are provided only for simple illustrations, but are not drawn to scale and do not reflect the actual relative dimensions. The following embodiments are provided to describe in detail the concept of the present disclosure, and are not intended to limit the scope thereof in any way.

First Embodiment

Figure 1:
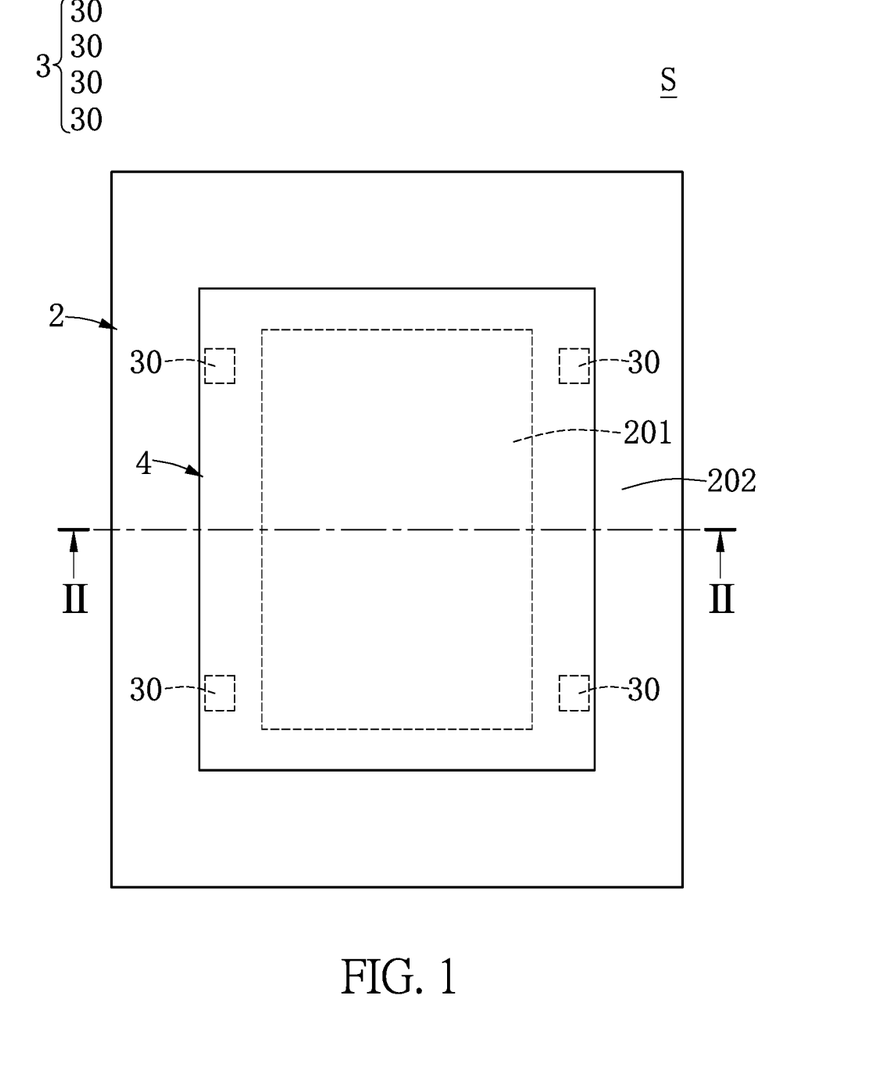
FIG. 1 shows a top, schematic view of an image-sensing assembly according to a first embodiment of the present disclosure.
Figure 2:
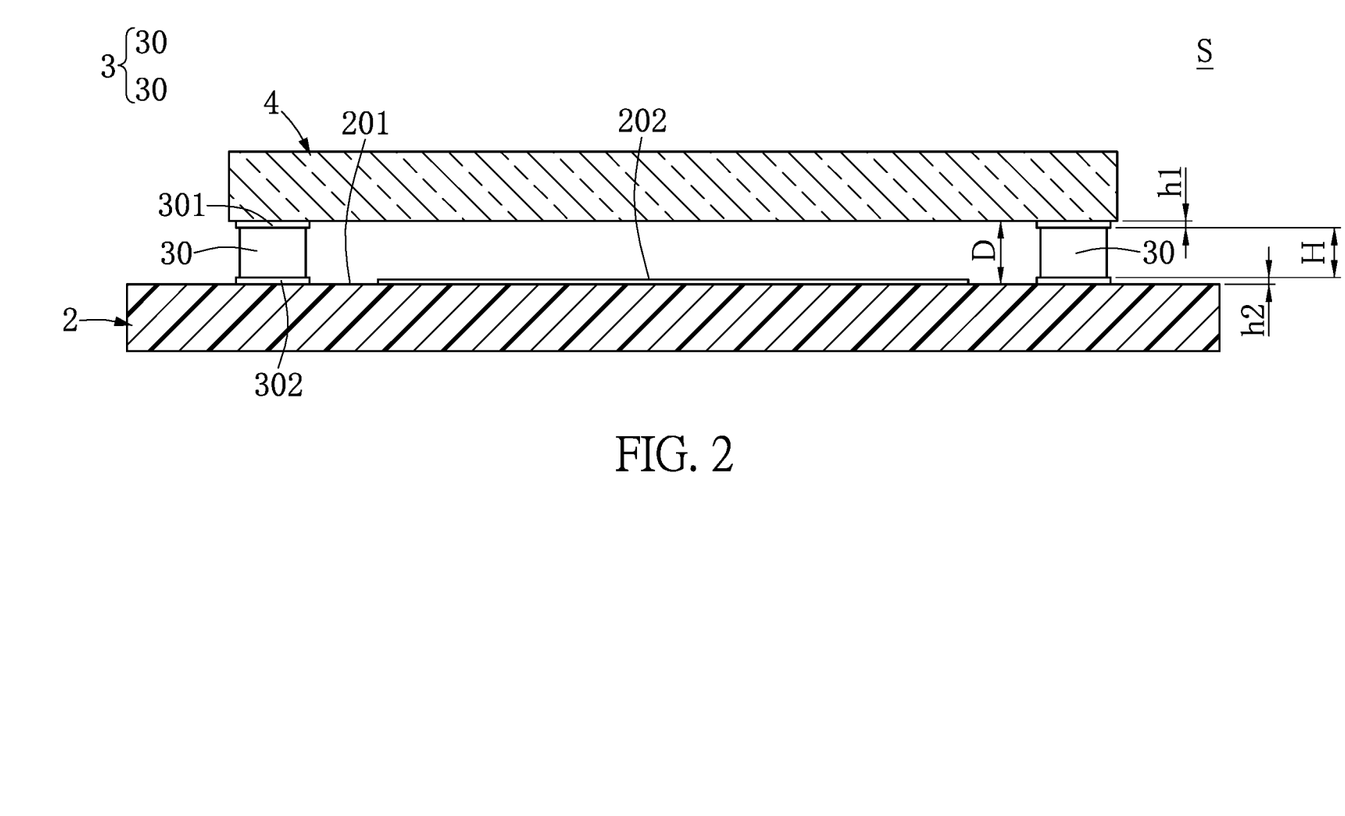
FIG. 2 shows a cross-sectional view taken along the section line II-II of FIG. 1.

Referring to FIG. 1 and FIG. 2, the first embodiment of the present disclosure provides an image-sensing assembly S, including an image-sensing chip 2, a spacer structure 3, and a filter element 4.

Firstly, referring to FIG. 1 and FIG. 2, the image-sensing chip 2 has an image sensing area 201 and a non-image sensing area 202 surrounding the image sensing area 201. For example, the image-sensing chip 2 may be a CMOS (Complementary Metal-Oxide-Semiconductor) sensor or any kind of image sensor that can be used for capturing images, but it is not meant to limit the scope of the present disclosure.

Moreover, referring to FIG. 1 and FIG. 2, the spacer structure 3 includes a plurality of prefabricated spacers 30 (or prefabricated pads), each having the same height, that are separated from each other and disposed on the non-image sensing area 202. For example, the prefabricated spacer 30 may be one of a glass, a silicon chip and a semiconductor chip, and the semiconductor chip may be an LED chip, but it is not meant to limit the scope of the present disclosure.

Furthermore, as shown in FIG. 2, the filter element 4 is disposed on the prefabricated spacers 30 of the spacer structure 3 so as to separate the filter element 4 from the image-sensing chip 2 by a predetermined distance D. For example, the filter element 4 may be a coated glass or a non-coated glass, but it is not meant to limit the scope of the present disclosure.

More particularly, as shown in FIG. 2, each of the prefabricated spacers 30 can be manufactured in advance, and each of the prefabricated spacers 30 can be placed between the image-sensing chip 2 and the filter element 4. In addition, each of the prefabricated spacers 30 has a first adhesive layer 301 formed on a top surface thereof to connect with the filter element 4, and a second adhesive layer 302 formed on a bottom surface thereof to connect with the non-image sensing area 202. For example, both the first adhesive layer 301 and the second adhesive layer 302 may be glue adhesions or glue tapes, but it is not meant to limit the scope of the present disclosure.

It should be noted that the prefabricated spacers 30 have the same height as shown in FIG. 2, so that the prefabricated spacers 30 with the same height can be used to hold and maintain the parallelism of the filter element 4 relative to the image-sensing chip 2. That is to say, the prefabricated spacers 30 with the same height can be used to prevent the filter element 4 from being tilted so as to increase the parallelism of the filter element 4 relative to the image-sensing chip 2.

It should be noted that as shown in FIG. 2, the predetermined distance D from the filter element 4 to the image-sensing chip 2 is substantially equal to the total of the height H of the prefabricated spacer 30, the height h1 of the first adhesive layer 301 and the height h2 of the second adhesive layer 302, so that the filter element 4 can be separated from the image-sensing chip 2 by the predetermined distance D due to the usage of the prefabricated spacers 30, the first adhesive layer 301 and the second adhesive layer 302. That is to say, the filter element 4 is separated from the image-sensing chip 2 by the predetermined distance D, so that particles that may have been attached to the filter element 4 would not be easily imaged on the image sensing area 201 of the image-sensing chip 2. Hence, the production yield rate of the present disclosure would be increased.

Figure 3:
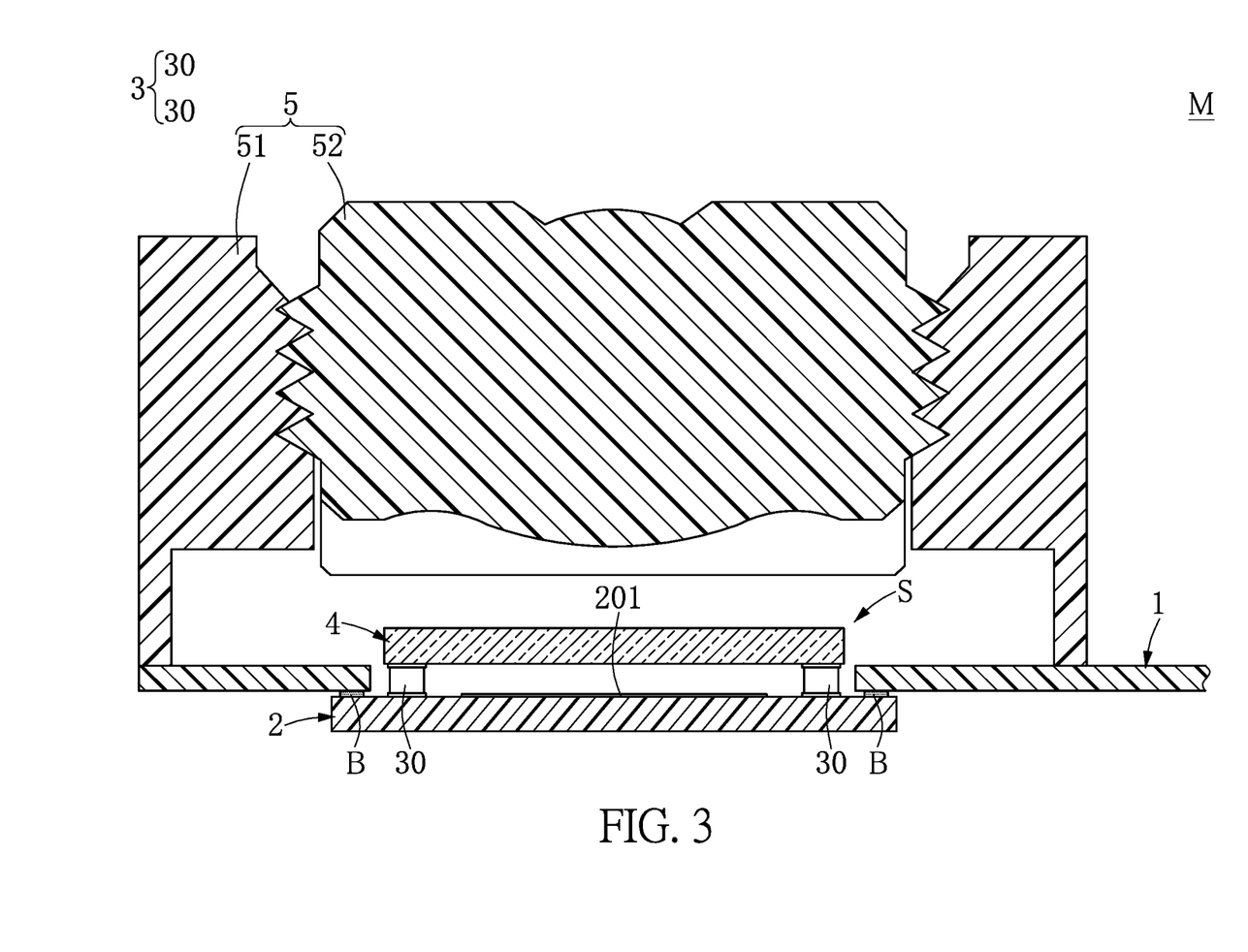
FIG. 3 shows a top, schematic view of an image-capturing module according to the first embodiment of the present disclosure.

Referring to FIG. 1 to FIG. 3, the first embodiment of the present disclosure further provides an image-capturing module M, including a circuit substrate 1, an image-sensing chip 2, a spacer structure 3, a filter element 4, and a lens assembly 5.

More particularly, as shown in FIG. 3, the image-sensing chip 2 is disposed on a bottom surface of the circuit substrate 1 and electrically connected to the circuit substrate 1. For example, the image-sensing chip 2 can be electrically connected to the circuit substrate 1 through a plurality of electrical conductors B such as solder balls or any type of conductive elements, and the circuit substrate 1 may be a PCB rigid board (such as BT, FR4, or FR5 etc.), a rigid-flex board, or ceramic board etc., but it is not meant to limit the scope of the present disclosure.

More particularly, as shown in FIG. 3, the lens assembly 5 includes a holder structure 51 (i.e., a lens holder) disposed on the circuit substrate 1 and a lens structure 52 being held or supported by the holder structure 51 and corresponding to the image sensing area 201 of the image-sensing chip 2. For example, the holder structure 51 may be a fixed seat or a voice coil motor (VCM), and the lens structure 52 may be composed of many lenses, but it is not meant to limit the scope of the present disclosure. In addition, for example, the holder structure 51 can be disposed on the top surface of the circuit substrate 1 through an adhesive paste (not shown), but it is not meant to limit the scope of the present disclosure.

Second Embodiment

Figure 4:
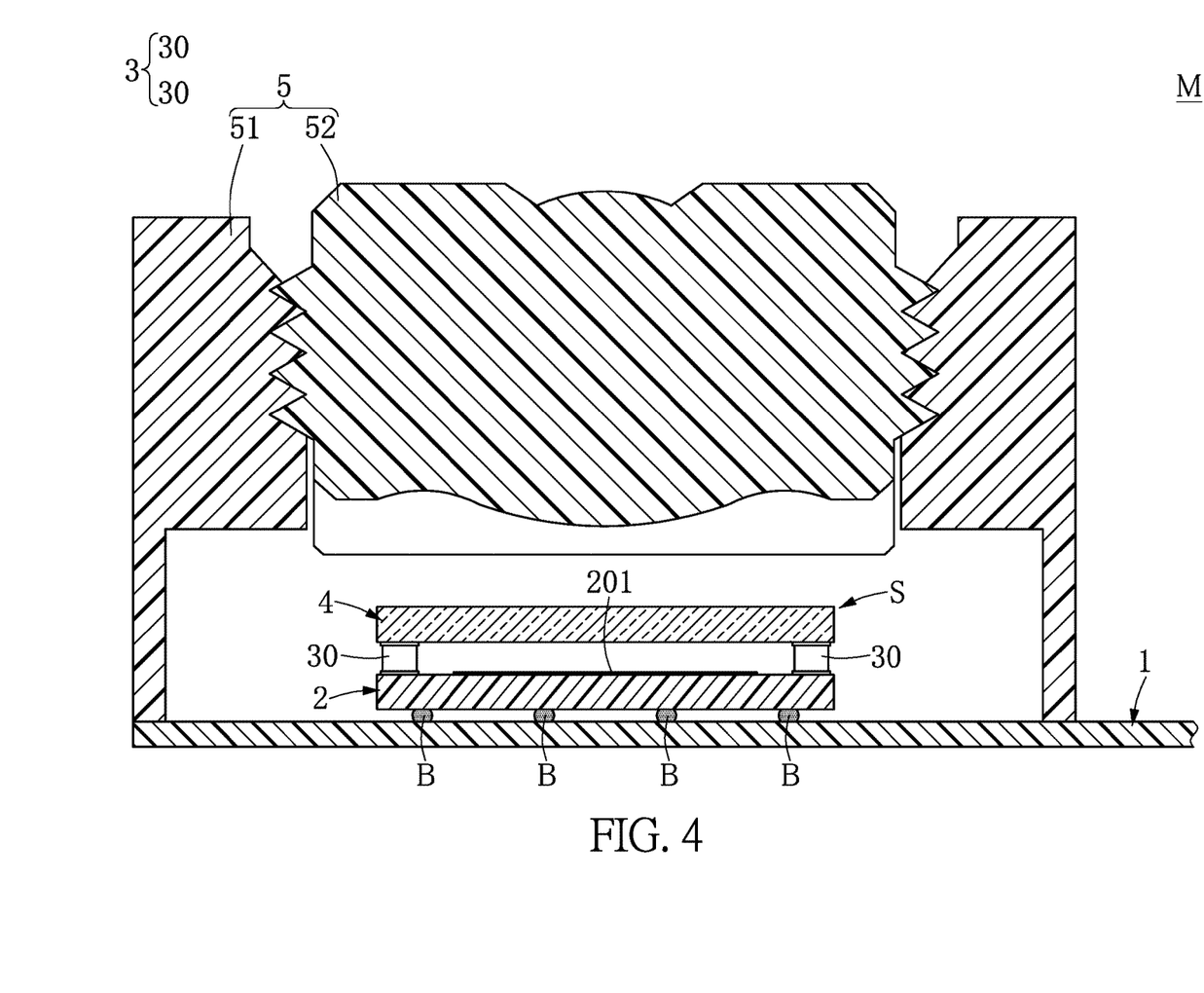
FIG. 4 shows a top, schematic view of an image-capturing module according to a second embodiment of the present disclosure.

Referring to FIG. 4, the second embodiment of the present disclosure provides an image-capturing module M, including a circuit substrate 1, an image-sensing chip 2, a spacer structure 3, a filter element 4, and a lens assembly 5. Comparing FIG. 4 with FIG. 1, the difference between the second embodiment and the first embodiment is as follows: in the second embodiment, the image-sensing chip 2 is disposed on a top surface of the circuit substrate 1, and the image-sensing chip 2 is electrically connected to the circuit substrate 1 through a plurality of electrical conductors B. For example, the electrical conductor B may be a solder ball or any type of conductive element, but it is not meant to limit the scope of the present disclosure.

Third Embodiment

Figure 5:
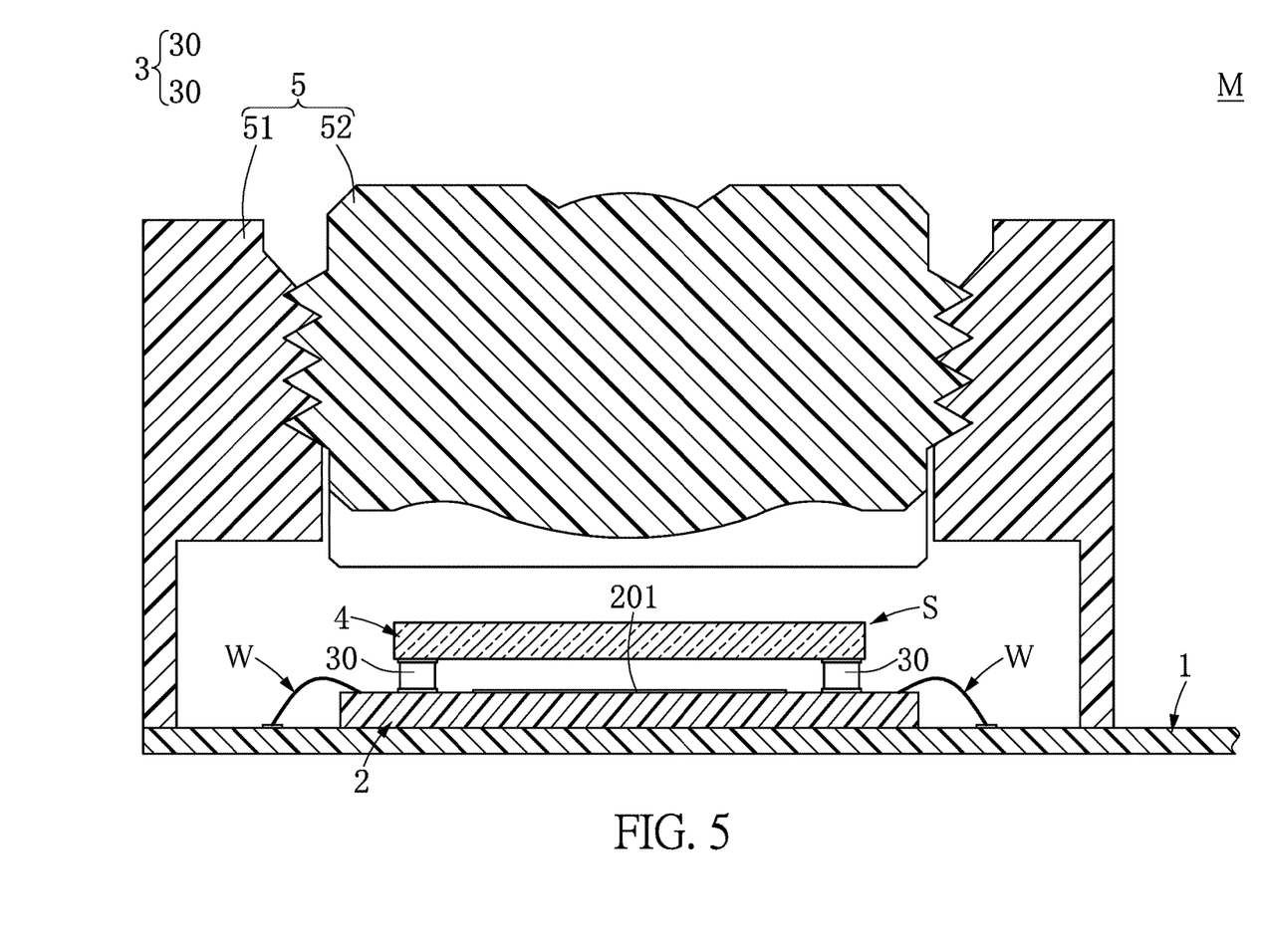
FIG. 5 shows a top, schematic view of an image-capturing module according to a third embodiment of the present disclosure.

Referring to FIG. 5, the third embodiment of the present disclosure provides an image-capturing module M, including a circuit substrate 1, an image-sensing chip 2, a spacer structure 3, a filter element 4, and a lens assembly 5. Comparing FIG. 5 with FIG. 3, the difference between the third embodiment and the first embodiment is as follows: in the third embodiment, the image-sensing chip 2 is disposed on a top surface of the circuit substrate 1, and the image-sensing chip 2 is electrically connected to the circuit substrate 1 through a plurality of conductive wires W.

Fourth Embodiment

Figure 6:
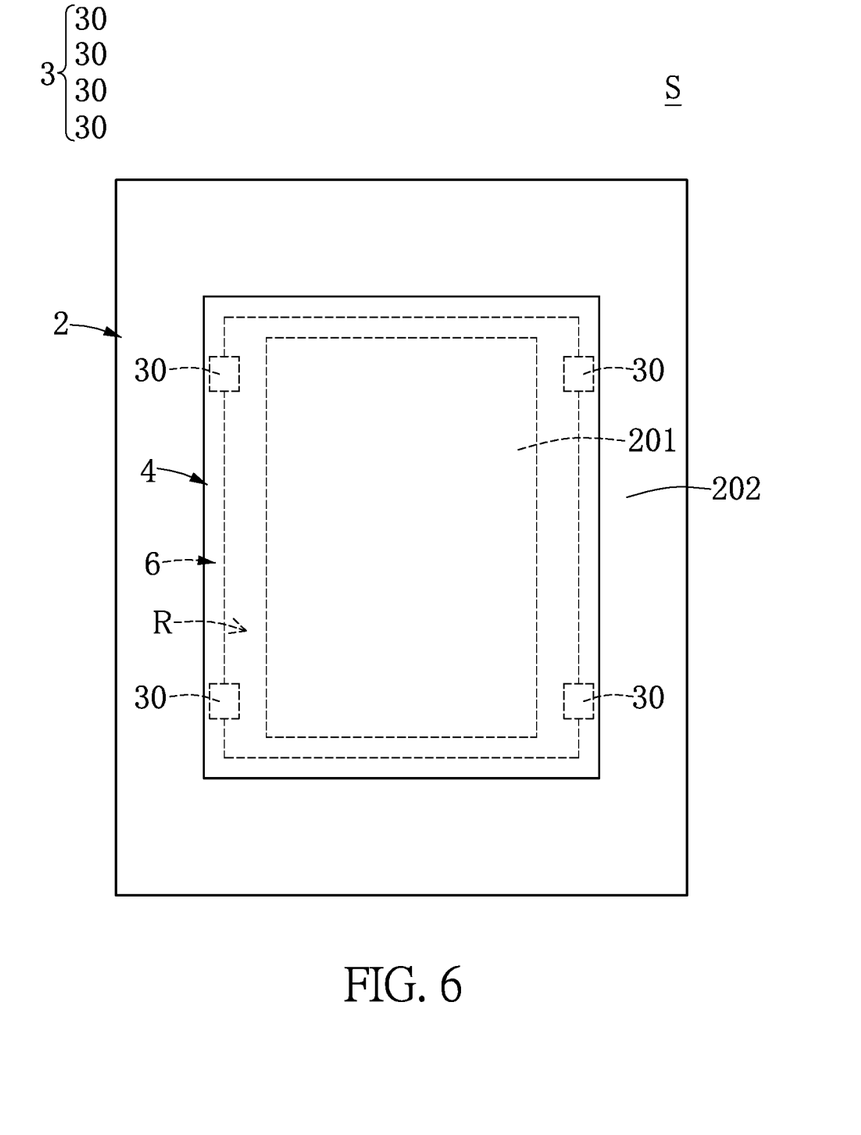
FIG. 6 shows a top, schematic view of an image-sensing assembly according to a fourth embodiment of the present disclosure.

Referring to FIG. 6, the fourth embodiment of the present disclosure provides an image-sensing assembly S, including an image-sensing chip 2, a spacer structure 3, and a filter element 4. Comparing FIG. 6 with FIG. 1, the difference between the fourth embodiment and the first embodiment is as follows: the image-sensing assembly S of the fourth embodiment further includes a filling paste 6.

More particularly, the filling paste 6 is surroundingly disposed between the image-sensing chip 2 and the filter element 4 and connected to the prefabricated spacers 30 to form an enclosed space R between the image-sensing chip 2 and the filter element 4 so as to protect the image sensing area 201. Hence, the filling paste 6 can be used to prevent the image sensing area 201 of the image-sensing chip 2 from being polluted by external objects such as dusts or particles, so that the image sensing area 201 of the image-sensing chip 2 can be protected by the filling paste 6 during the manufacturing process of the image-capturing module M. For example, the filter element 4 may be formed by epoxy or silicon, but it is not meant to limit the scope of the present disclosure.

Fifth Embodiment

Figure 7:
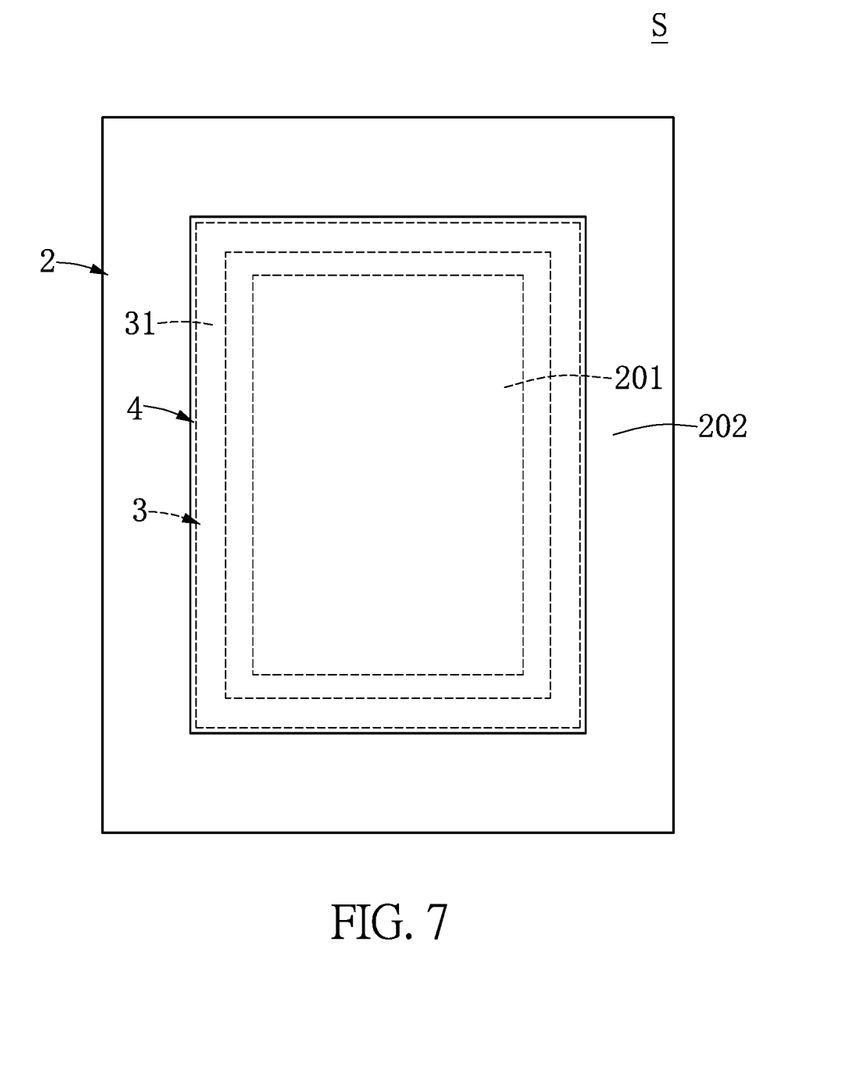
FIG. 7 shows a top, schematic view of an image-sensing assembly according to a fifth embodiment of the present disclosure.

Referring to FIG. 7, the fifth embodiment of the present disclosure provides an image-sensing assembly S, including an image-sensing chip 2, a spacer structure 3, and a filter element 4. Comparing FIG. 7 with FIG. 1, the difference between the fifth embodiment and the first embodiment is as follows: in the fifth embodiment, the spacer structure 3 includes a surrounding prefabricated spacer 31 disposed on the non-image sensing area 202 to surround the image sensing area 201, and the height of the surrounding prefabricated spacer 31 is uniform.

Therefore, since the height of the surrounding prefabricated spacer 31 is uniform, the surrounding prefabricated spacer 31 with the uniform height can be used to hold and maintain the parallelism of the filter element 4 relative to the image-sensing chip 2. That is to say, the surrounding prefabricated spacer 31 with the uniform height can be used to prevent the filter element 4 from being tilted so as to increase the parallelism of the filter element 4 relative to the image-sensing chip 2. In addition, the filter element 4 is separated from the image-sensing chip 2 by the predetermined distance, so that particles that may have been attached to the filter element 4 would not be easily imaged on the image sensing area 201 of the image-sensing chip 2. Hence, the production yield rate of the present disclosure would be increased.

Sixth Embodiment

Figure 8:
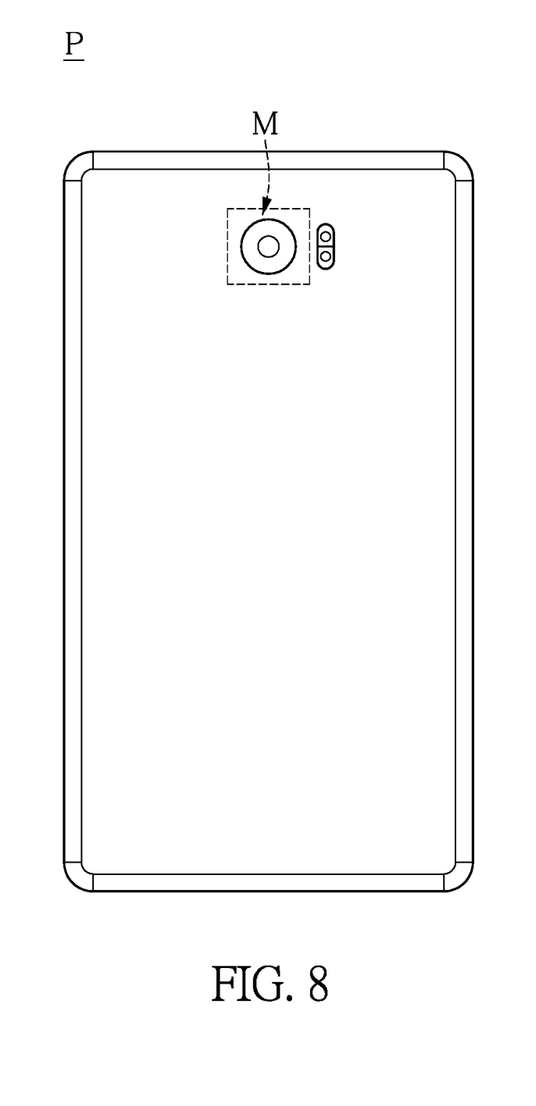
FIG. 8 shows a schematic view of a portable electronic device according to a sixth embodiment of the present disclosure.

Referring to FIG. 8, the sixth embodiment of the present disclosure provides a portable electronic device P using an image-capturing module M of any one of the first to the third embodiments. For example, the electronic device P may be a smart phone, a laptop, or a tablet computer, but it is not meant to limit the scope of the present disclosure. As shown in FIG. 8, the image-capturing module M can be used as a rear camera of the portable electronic device P, and the image-capturing module M includes a circuit substrate 1, an image-sensing chip 2, a spacer structure 3, a filter element 4, and a lens assembly 5, but it is merely an example and is not meant to limit the scope of the present disclosure.

Therefore, by matching the features of "the spacer structure 3 being disposed on the non-image sensing area 202" and "the filter element 4 being disposed on the spacer structure 3 so as to separate the filter element 4 from the image-sensing chip 2 by a predetermined distance D", the parallelism of the filter element 4 relative to the image-sensing chip 2 can be maintained so as to prevent the filter element 4 from being tilted relative to the image-sensing chip 2, and particles that may have been attached to the filter element 4 would not be easily imaged on the image sensing area 201 of the image-sensing chip 2. Hence, the production yield rate of the present disclosure would be increased.

Moreover, the filling paste 6 is surroundingly disposed between the image-sensing chip 2 and the filter element 4 and connected to the prefabricated spacers 30 to form an enclosed space R between the image-sensing chip 2 and the filter element 4 so as to protect the image sensing area 201. Hence, the filling paste 6 can be used to prevent the image sensing area 201 of the image-sensing chip 2 from being polluted by external objects such as dusts or particles, so that the image sensing area 201 of the image-sensing chip 2 can be protected by the filling paste 6 during the manufacturing process of the image-capturing module M.

The aforementioned descriptions merely represent the preferred embodiments of the present disclosure, without any intention to limit the scope of the present disclosure which is fully described only within the following claims. Various equivalent changes, alterations or modifications based on the claims of the present disclosure are all, consequently, viewed as being embraced by the scope of the present disclosure.

What is claimed is:

1. An image-capturing module, comprising:
   a circuit substrate;
   an image-sensing chip electrically connected to the circuit substrate, wherein the image-sensing chip has an image sensing area and a non-image sensing area surrounding the image sensing area;
   a spacer structure disposed on the non-image sensing area;
   a filter element disposed on the spacer structure so as to separate the filter element from the image-sensing chip by a predetermined distance; and
   a lens assembly including a holder structure disposed on the circuit substrate and a lens structure being held by the holder structure and corresponding to the image-sensing area;
   wherein the spacer structure includes a plurality of prefabricated spacers separated from each other and disposed on the non-image sensing area, each of the prefabricated spacers has a first adhesive layer formed on a top surface thereof to connect with the filter element, each of the prefabricated spacers has a second adhesive layer formed on a bottom surface thereof to connect with the non-image sensing area.

2. The image-capturing module of claim 1, wherein the prefabricated spacers have the same height, wherein the predetermined distance from the filter element to the image-sensing chip is substantially equal to the total height of the prefabricated spacer, the first adhesive layer and the second adhesive layer so as to prevent particles on the filter element from being imaged on the image sensing area of the image-sensing chip, wherein the prefabricated spacer is one of a glass, a silicon chip and a semiconductor chip, both the first adhesive layer and the second adhesive layer are glue adhesions or glue tapes, and the filter element is a coated glass or a non-coated glass.

3. The image-capturing module of claim 2, further comprising: a filling paste surroundingly disposed between the image-sensing chip and the filter element and connected to the prefabricated spacers to form an enclosed space between the image-sensing chip and the filter element so as to protect the image sensing area, wherein the image-sensing chip is disposed on a bottom surface of the circuit substrate, and the image-sensing chip is electrically connected to the circuit substrate through a plurality of electrical conductors.

4. The image-capturing module of claim 2, further comprising: a filling paste surroundingly disposed between the image-sensing chip and the filter element and connected to the prefabricated spacers to form an enclosed space between the image-sensing chip and the filter element so as to protect the image sensing area, wherein the image-sensing chip is disposed on a top surface of the circuit substrate, and the image-sensing chip is electrically connected to the circuit substrate through a plurality of conductive wires.

5. The image-capturing module of claim 2, further comprising: a filling paste surroundingly disposed between the image-sensing chip and the filter element and connected to the prefabricated spacers to form an enclosed space between the image-sensing chip and the filter element so as to protect the image sensing area, wherein the image-sensing chip is disposed on a top surface of the circuit substrate, and the image-sensing chip is electrically connected to the circuit substrate through a plurality of electrical conductors.

6. An image-sensing assembly, comprising:
   an image-sensing chip having an image sensing area and a non-image sensing area surrounding the image sensing area;
   a spacer structure disposed on the non-image sensing area; and
   a filter element disposed on the spacer structure so as to separate the filter element from the image-sensing chip by a predetermined distance;
   wherein the spacer structure includes a plurality of prefabricated spacers separated from each other and disposed on the non-image sensing area, each of the prefabricated spacers has a first adhesive layer formed on a top surface thereof to connect with the filter element, each of the prefabricated spacers has a second adhesive layer formed on a bottom surface thereof to connect with the non-image sensing area.

7. The image-sensing assembly of claim 6, wherein the height of the surrounding prefabricated spacer is uniform.

8. A portable electronic device using an image-capturing module, characterized in that the image-capturing module comprises:
   a circuit substrate;
   an image-sensing chip electrically connected to the circuit substrate, wherein the image-sensing chip has an image sensing area and a non-image sensing area surrounding the image sensing area;
   a spacer structure disposed on the non-image sensing area;
   a filter element disposed on the spacer structure so as to separate the filter element from the image-sensing chip by a predetermined distance; and
   a lens assembly including a holder structure disposed on the circuit substrate and a lens structure being held by the holder structure and corresponding to the image-sensing area;
   wherein the spacer structure includes a plurality of prefabricated spacers separated from each other and disposed on the non-image sensing area, each of the prefabricated spacers has a first adhesive layer formed on a top surface thereof to connect with the filter element, each of the prefabricated spacers has a second adhesive layer formed on a bottom surface thereof to connect with the non-image sensing area.

9. The portable electronic device of claim 8, wherein the prefabricated spacers have the same height, wherein the predetermined distance from the filter element to the image-sensing chip is substantially equal to the total height of the prefabricated spacer, the first adhesive layer and the second adhesive layer so as to prevent particles on the filter element from being imaged on the image sensing area of the image-sensing chip, wherein the prefabricated spacer is one of a glass, a silicon chip and a semiconductor chip, both the first adhesive layer and the second adhesive layer are glue adhesions or glue tapes, and the filter element is a coated glass or a non-coated glass.

10. The portable electronic device of claim 9, further comprising: a filling paste surroundingly disposed between the image-sensing chip and the filter element and connected to the prefabricated spacers to form an enclosed space between the image-sensing chip and the filter element so as to protect the image sensing area.

* * * * *